United States Patent
Shin et al.

(10) Patent No.: US 12,336,383 B2
(45) Date of Patent: Jun. 17, 2025

(54) DISPLAY PANEL AND DISPLAY DEVICE COMPRISING THE SAME

(71) Applicant: LG Display Co., Ltd., Seoul (KR)

(72) Inventors: Young-Sub Shin, Goyang-si (KR); Keun-Young Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/543,671

(22) Filed: Dec. 18, 2023

(65) Prior Publication Data

US 2024/0121981 A1    Apr. 11, 2024

Related U.S. Application Data

(63) Continuation of application No. 18/166,843, filed on Feb. 9, 2023, now Pat. No. 11,943,967, which is a
(Continued)

(30) Foreign Application Priority Data

Dec. 24, 2018    (KR) .................. 10-2018-0168152

(51) Int. Cl.
*G06F 3/041*    (2006.01)
*H10K 50/86*    (2023.01)
(Continued)

(52) U.S. Cl.
CPC .......... *H10K 50/865* (2023.02); *G06F 3/041* (2013.01); *H10K 59/122* (2023.02); *H10K 59/40* (2023.02); *G06F 2203/04112* (2013.01)

(58) Field of Classification Search
CPC . G06F 2203/04103; G06F 2203/04111; G06F 2203/04112; G06F 3/041;
(Continued)

(56) References Cited

U.S. PATENT DOCUMENTS 7,817,361 B2   10/2010  Mimura et al.
8,382,299 B2    2/2013  Mimura et al.
(Continued)

FOREIGN PATENT DOCUMENTS

CN    203309790 U    11/2013
CN    205553478 U    9/2016
(Continued)

OTHER PUBLICATIONS

China National Intellectual Property Administration, Office Action, CN Patent Application No. 201911282549.3, Mar. 14, 2023, 13 pages.
(Continued)

*Primary Examiner* — Insa Sadio
(74) *Attorney, Agent, or Firm* — Fenwick & West LLP

(57) ABSTRACT

Disclosed is a display panel and a display device capable of reducing the reflection of external light. The display panel includes a touch sensor, disposed on an encapsulation unit, and an antireflective film disposed in a non-emission area of the touch sensor so as to overlap each other, whereby it is possible to reduce external light from being incident on the touch sensor and a routing line, and therefore it is possible to reduce the reflectance of external light without using an expensive polarizing plate.

14 Claims, 9 Drawing Sheets

Related U.S. Application Data continuation of application No. 17/408,001, filed on Aug. 20, 2021, now Pat. No. 11,611,060, which is a continuation of application No. 16/707,470, filed on Dec. 9, 2019, now Pat. No. 11,127,929.

(51) Int. Cl.
*H10K 59/122* (2023.01)
*H10K 59/40* (2023.01)

(58) Field of Classification Search
CPC .. G06F 3/0412; G06F 3/04164; G06F 3/0443; H01L 2251/5369; H01L 27/3213; H01L 27/323; H01L 27/3246; H01L 51/5253; H01L 51/5271; H01L 51/5281; H01L 51/5284

See application file for complete search history.

(56) References Cited

U.S. PATENT DOCUMENTS

| | | |
|---|---|---|
| 10,386,548 B2 | 8/2019 | Tian et al. |
| 10,613,371 B2 | 4/2020 | Park et al. |
| 10,763,313 B2 | 9/2020 | Beak et al. |
| 11,061,277 B2 | 7/2021 | Wang et al. |
| 2007/0268586 A1 | 11/2007 | Mimura et al. |
| 2010/0328778 A1 | 12/2010 | Mimura et al. |
| 2017/0322349 A1 | 11/2017 | Tian et al. |
| 2018/0143488 A1 | 5/2018 | Park et al. |
| 2018/0331160 A1 | 11/2018 | Beak et al. |
| 2019/0214596 A1* | 7/2019 | Park .............. G06F 3/0446 |
| 2020/0161398 A1 | 5/2020 | Bang et al. |
| 2020/0203669 A1 | 6/2020 | Shin et al. |
| 2021/0080787 A1 | 3/2021 | Wang et al. |
| 2021/0384477 A1* | 12/2021 | Shin .............. H10K 59/40 |

FOREIGN PATENT DOCUMENTS

| | | |
|---|---|---|
| CN | 208060755 U | 11/2018 |
| KR | 10-2007-0111348 A | 11/2007 |
| KR | 10-2017-0065552 A | 6/2017 |
| KR | 10-2018-0057942 A | 5/2018 |
| KR | 10-2018-0124607 A | 11/2018 |

OTHER PUBLICATIONS

United States Office Action, U.S. Appl. No. 16/707,470, filed Mar. 16, 2021, eight pages.
United States Office Action, U.S. Appl. No. 16/707,470, filed Oct. 29, 2020, seven pages.
United States Office Action, U.S. Appl. No. 17/408,001, filed Aug. 4, 2022, 12 pages.
United States Office Action, U.S. Appl. No. 18/166,843, filed Jun. 23, 2023, 19 pages.
Korean Intellectual Property Office, Office Action, Korean Patent Application No. 10-2018-0168152, Sep. 10, 2024, eight pages.
Korean Intellectual Property Office, Office Action, Korean Patent Application No. 10-2018-0168152, Jan. 30, 2024, eight pages.

* cited by examiner

DISPLAY PANEL AND DISPLAY DEVICE COMPRISING THE SAME

CROSS-REFERENCE TO RELATED APPLICATIONS

This application is a continuation of U.S. patent application Ser. No. 18/166,843 filed on Feb. 9, 2023, which is a continuation of U.S. patent application Ser. No. 17/408,001 filed on Aug. 20, 2021, which is a continuation of U.S. patent application Ser. No. 16/707,470 filed on Dec. 9, 2019, which claims the benefit of Republic of Korea Patent Application No. 10-2018-0168152, filed on Dec. 24, 2018, each of which is hereby incorporated by reference in its entirety.

BACKGROUND

Field of Technology

The present disclosure relates to a display panel and a display device, and more particularly to a display panel and a display device capable of reducing the reflection of external light.

Discussion of the Related Art

Image display devices, which are a core technology in the information and communication age and serve to display various kinds of information on a screen, have been developed such that the image display devices are thinner, lighter, and portable and exhibit high performance. As a result, flat panel display devices, which have lower weight and volume than cathode ray tubes (CRT), have received a great deal of attention.

Representative examples of such flat panel display devices may include a liquid crystal display (LCD) device, a plasma display panel (PDP) device, an organic light-emitting display (OLED) device, and an electrophoretic display (ED) device.

A flat panel display device includes a plurality of signal lines and a plurality of driving electrodes. External light is reflected by the signal lines and the driving electrodes, whereby external visibility is reduced.

In the case in which a polarizing plate is used in order to solve this problem, it is possible to reduce the reflection of external light. However, transmittance is reduced and price competitiveness is deteriorated due to the polarizing plate, which is expensive.

SUMMARY

Accordingly, the present disclosure is directed to a display panel and a display device that substantially obviates one or more problems due to limitations and disadvantages of the related art.

An object of the present disclosure is to provide a display panel and a display device capable of preventing the reflection of external light.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display panel includes a touch sensor, disposed on an encapsulation unit, and an antireflective film disposed in a non-emission area of the touch sensor so as to overlap each other, whereby it is possible to prevent external light from being incident on the touch sensor and a routing line, and therefore it is possible to reduce the reflectance of external light without using an expensive polarizing plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts.

Figure 1:
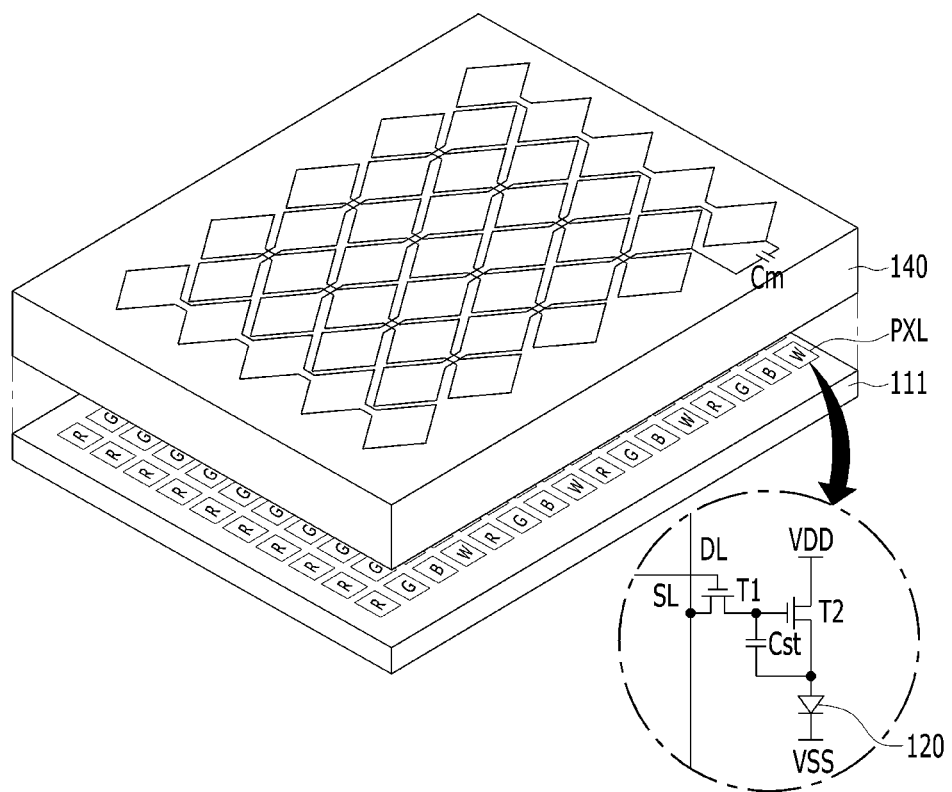
FIG. 1 is a perspective view showing an organic light-emitting display panel having a touch sensor according to one embodiment of the present disclosure.
Figure 2:
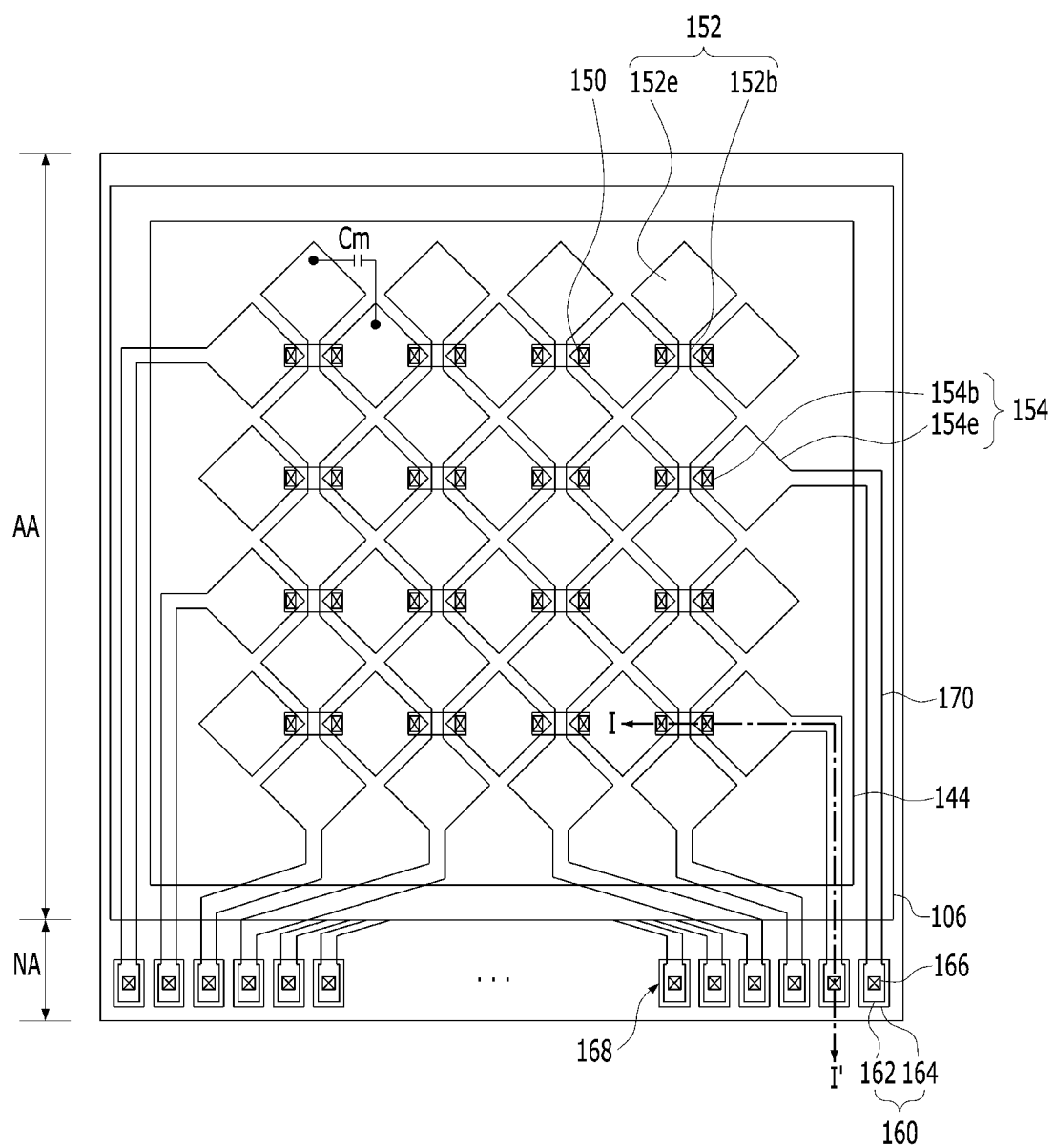
FIG. 2 is a plan view of the organic light-emitting display panel having the touch sensor shown in FIG. 1 according to one embodiment of the present disclosure.

FIG. 1 is a perspective view showing an organic light-emitting display panel having a touch sensor according to the present disclosure, and FIG. 2 is a plan view of the organic light-emitting display panel having the touch sensor according to the present disclosure.

The organic light-emitting display panel having the touch sensor shown in FIGS. 1 and 2 includes a plurality of subpixels PXL arranged on a substrate 111 in a matrix fashion, an encapsulation unit 140 disposed on the subpixels PXL, and mutual capacitance Cm disposed on the encapsulation unit 140.

The organic light-emitting display panel having the touch sensor displays an image through the subpixels PXL, each of which includes a light-emitting element 120, during a display period. In addition, the organic light-emitting display panel having the touch sensor detects variation in mutual capacitance Cm (the touch sensor) due to a user's touch during a touch period to sense whether a touch has been performed and the touched position.

Each of the subpixels PXL, which are disposed in an active area of the organic light-emitting display panel having the touch sensor, includes a pixel-driving circuit and a light-emitting element 120 connected to the pixel-driving circuit.

As shown in FIG. 1, the pixel-driving circuit includes a switching transistor T1, a driving transistor T2, and a storage capacitor Cst. Meanwhile, in the present disclosure, the pixel-driving circuit has been described as including two transistors T and one capacitor C (2T1C) by way of example. However, the present disclosure is not limited thereto. That is, a 3T1C or 3T2C type pixel-driving circuit having three or more transistors T and one or more capacitors C may be used.

When a scan pulse is supplied to a scan line SL, the switching transistor T1 is turned on to supply a data signal, which is supplied to a data line DL, to the storage capacitor Cst and to a gate electrode of the driving transistor T2.

In response to the data signal supplied to the gate electrode of the driving transistor T2, the driving transistor T2 controls the current that is supplied from a high-voltage (VDD) supply line to the light-emitting element 120 to adjust the amount of light emitted by the light-emitting element 120. Even when the switching transistor T1 is turned off, the driving transistor T2 supplies uniform current to the light-emitting element 120 using the voltage charged in the storage capacitor Cst such that the light-emitting element 120 keeps emitting light until a data signal of the next frame is supplied.

Figure 3:
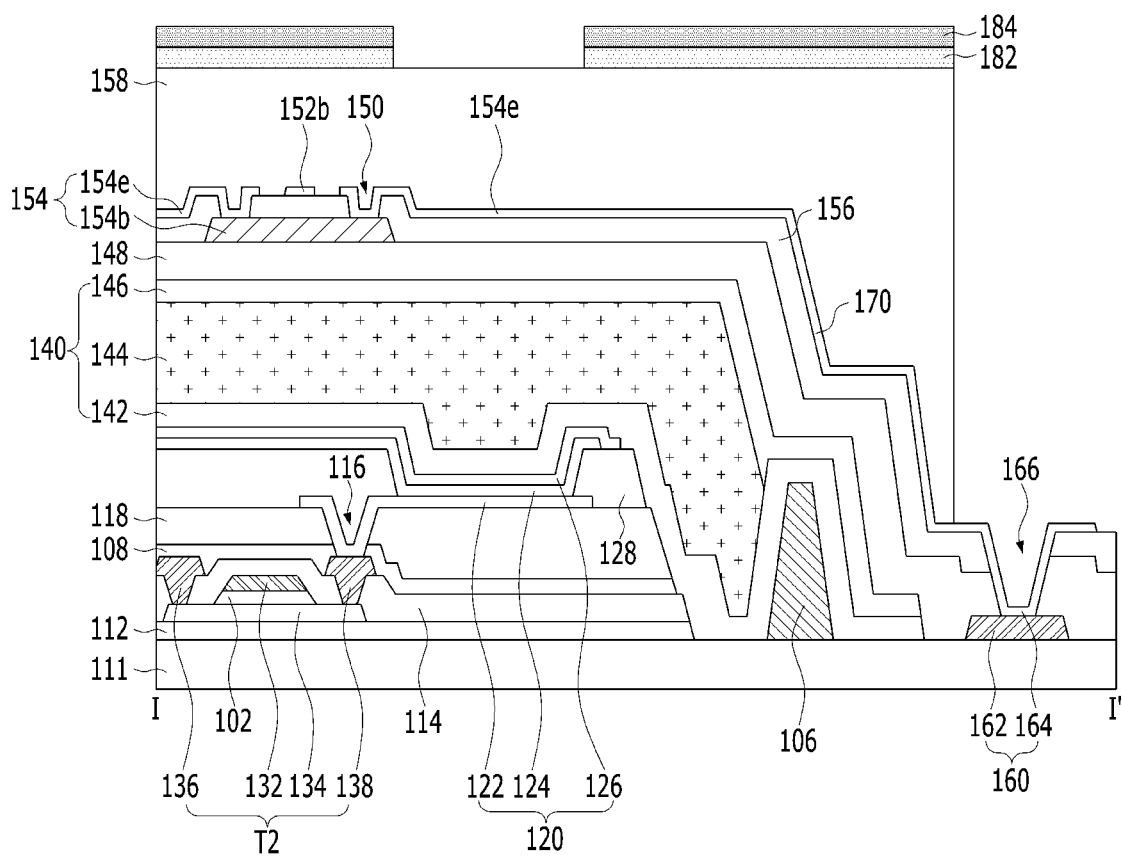
FIG. 3 is a sectional view of the organic light-emitting display panel taken along line I-I' of FIG. 2 according to one embodiment of the present disclosure.

To this end, as shown in FIG. 3, the driving transistor T2 includes a semiconductor layer 134 disposed on a buffer layer 112, a gate electrode 132 overlapping the semiconductor layer 134 in the state in which a gate dielectric film 102 is disposed therebetween, and source electrode 136 and drain electrode 138 formed on an interlayer dielectric film 114 so as to contact the semiconductor layer 134.

The semiconductor layer 134 is made of at least one of an amorphous semiconductor material, a polycrystalline semiconductor material, or an oxide semiconductor material. The semiconductor layer 134 includes a channel area, a source area, and a drain area. The channel area overlaps the gate electrode 132 in the state in which the gate dielectric film 102 is disposed therebetween so as to be formed between the source and drain electrodes 136 and 138. The source area is electrically connected to the source electrode 136 via a source contact hole, which is formed through the interlayer dielectric film 114. The drain area is electrically connected to the drain electrode 138 via a drain contact hole, which is formed through the interlayer dielectric film 114.

The gate electrode 132 may be made of one of molybdenum (Mo), aluminum (Al), chrome (Cr), gold (Au), titanium (Ti), nickel (Ni), neodymium (Nd), or copper (Cu) or an alloy thereof, and may have a single-layered structure or a multi-layered structure. However, the present disclosure is not limited thereto.

The gate electrode 132 overlaps the channel area of the semiconductor layer 134 in the state in which the gate dielectric film 102 is disposed therebetween. At this time, as shown in FIG. 3, the gate dielectric film 102 may be formed so as to have the same line width as the gate electrode 132 in order to expose the side surface of the semiconductor layer 134, or may be formed so as to have a larger line width than the gate electrode 132 in order to cover the side surface of the semiconductor layer 134.

Each of the source and drain electrodes 136 and 138 may be made of one of molybdenum (Mo), aluminum (Al), chrome (Cr), gold (Au), titanium (Ti), nickel (Ni), neodymium (Nd), or copper (Cu) or an alloy thereof, and may have a single-layered structure or a multi-layered structure. However, the present disclosure is not limited thereto. The source electrode 136 is connected to the source area of the semiconductor layer 134, which is exposed through the source contact hole formed through both the gate dielectric film 102 and the interlayer dielectric film 114 or only through the interlayer dielectric film 114. The drain electrode 138 faces the source electrode, and is connected to the drain area of the semiconductor layer 134 via the drain contact hole, which is formed through both the gate dielectric film 102 and the interlayer dielectric film 114 or only through the interlayer dielectric film 114.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving transistor T2, which is exposed through a pixel contact hole 116 formed through a passivation film 108 and a planarization layer 118 disposed on the driving transistor T2. The anode electrode 122 of each subpixel is formed so as to be exposed by a bank 128. The bank 128 is formed so as to expose the anode 132. The bank 128 may be made of an opaque material (e.g. black) in order to reduce optical interference between neighboring subpixels. In this case, the bank 128 includes a light-blocking material made of at least one of a color pigment, organic black, or carbon.

The at least one light-emitting stack 124 is formed on the anode electrode 122 in a light-emitting area defined by the bank 128. The at least one light-emitting stack 124 is formed by stacking a hole-related layer, an organic light-emitting layer, and an electron-related layer on the anode electrode 122 in that order or in the reverse order. In addition, the light-emitting stack 124 may include first and second light-emitting stacks that are opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter, which is located above or under the light-emitting stack 124, to realize a color image. Alternatively, each light-emitting stack 124 may generate colored light corresponding to a respective subpixel without a separate color filter to realize a color image. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode electrode 126 is formed to be opposite the anode electrode 122 in the state in which the light-emitting stack 124 is disposed therebetween, and is connected to a low-voltage (VSS) supply line.

The encapsulation unit 140 reduces external moisture or oxygen from permeating into the light-emitting element 120, which has low resistance to external moisture or oxygen.

To this end, the encapsulation unit 140 includes at least one of inorganic encapsulation layer 142 and inorganic encapsulation layer 146 and at least one organic encapsulation layer 144. In the present disclosure, an encapsulation unit 140 having a structure in which a first inorganic encapsulation layer 142, an organic encapsulation layer 144, and a second inorganic encapsulation layer 146 are sequentially stacked will be described by way of example.

The first inorganic encapsulation layer 142 is formed on the substrate 111, on which the cathode electrode 126 is formed. The second inorganic encapsulation layer 146 is formed on the substrate 111, on which the organic encapsulation layer 144 is formed, and is formed to surround the upper surface, the lower surface, and the side surface of the organic encapsulation layer 144 together with the first inorganic encapsulation layer 142.

The first and second inorganic encapsulation layers 142 and 146 reduce or prevent external moisture or oxygen from permeating into the light-emitting stack 124. Each of the first and second inorganic encapsulation layers 142 and 146 is made of an inorganic dielectric material that can be deposited at a low temperature, such as silicon nitride ($SiN_x$), silicon oxide ($SiO_x$), silicon oxide nitride (SiON), or aluminum oxide ($Al_2O_3$). Consequently, each of the first and second inorganic encapsulation layers 142 and 146 is deposited in a low-temperature atmosphere, whereby it is possible to reduce damage to the light-emitting stack 124, which has low resistance to a high-temperature atmosphere, when each of the first and second inorganic encapsulation layers 142 and 146 is deposited.

Each of the first and second inorganic encapsulation layers 142 and 146 is formed to have a larger thickness than the passivation film 108, whereby each of the first and second inorganic encapsulation layers 142 and 146 has low resistance to external impact. For this reason, each of the first and second inorganic encapsulation layers 142 and 146 is formed so as not to be disposed in a bending area BA.

The organic encapsulation layer 144 reduces stress between the layers due to bending of the organic light-emitting device and improves planarization. The organic encapsulation layer 144 is formed on the substrate 111, on which the first inorganic encapsulation layer 142 is formed, and is made of a non-photosensitive organic dielectric material, such as a particle cover layer (PCL), an acrylic resin, an epoxy resin, polyimide, polyethylene, or silicon oxycarbide (SiOC), or a photosensitive organic dielectric material, such as photo acrylic. The organic encapsulation layer 144 is disposed in an active area AA, excluding a non-active area NA. At this time, a dam 106 is disposed on the substrate 111 or the passivation film 108 in order to prevent the organic encapsulation layer 144 from spreading to the non-active area NA.

A touch-sensing line 154 and a touch-driving line 152 are disposed in the active area AA of the encapsulation unit 140 to intersect each other in the state in which a touch dielectric film 156 is disposed therebetween. Mutual capacitance Cm is formed at the intersection of the touch-sensing line 154 and the touch-driving line 152. Consequently, the mutual capacitance Cm charges an electric charge by a touch-driving pulse supplied to the touch-driving line 152 and discharges the charged electric charge to the touch-sensing line 154, thereby serving as a touch sensor.

The touch-driving line 152 includes a plurality of first touch electrodes 152e and first bridges 152b for electrically interconnecting together the first touch electrodes 152e.

The first touch electrodes 152e are spaced apart from each other on the touch dielectric film 156 by a predetermined distance in a Y direction, which is a first direction. Each of the first touch electrodes 152e is electrically connected to an adjacent first touch electrode 152e via a corresponding one of the first bridges 152b.

The first bridges 152b are disposed on the touch dielectric film 156, which is disposed in the same plane as the first touch electrodes 152e, so as to be electrically connected to the first touch electrodes 152e without separate contact holes. The first bridges 152b are disposed to overlap the bank 128, whereby it is possible to reduce the reduction of an aperture ratio due to the first bridges 152b.

The touch-sensing line 154 includes a plurality of second touch electrodes 154e and second bridges 154b for electrically interconnecting the second touch electrodes 154e.

The second touch electrodes 154e are spaced apart from each other on the touch dielectric film 156 by a predetermined distance in an X direction, which is a second direction. Each of the second touch electrodes 154e is electrically connected to an adjacent second touch electrode 154e via a corresponding one of the second bridges 154b.

The second bridges 154b are formed on a touch buffer layer 148, and are electrically connected to the second touch electrodes 154e via touch contact holes 150, which are formed through the touch dielectric film 156. In the same manner as the first bridges 152b, the second bridges 154b are disposed to overlap the bank 128, whereby it is possible to reduce the reduction of an aperture ratio due to the second bridges 154b.

Meanwhile, the structure in which the second bridges 154b are disposed on the touch buffer layer 148 to contact the touch buffer layer 148 has been described by way of example with reference to FIG. 3. Alternatively, at least one of the first and second touch electrodes 152e and 154e or the first bridges 152b may be disposed on the touch buffer layer 148 to contact the touch buffer layer 148, and the second bridges 154b may be disposed on the touch dielectric film 156.

In addition, each of the first bridges 152b, the second bridges 154b, the first touch electrodes 152e, and the second touch electrodes 154e has been described by way of example as being formed in a plate shape, as shown in FIG. 2. Alternatively, at least one of the first bridges 152b, the second bridges 154b, the first touch electrodes 152e, or the second touch electrodes 154e may be formed in a mesh shape.

Figure 4:
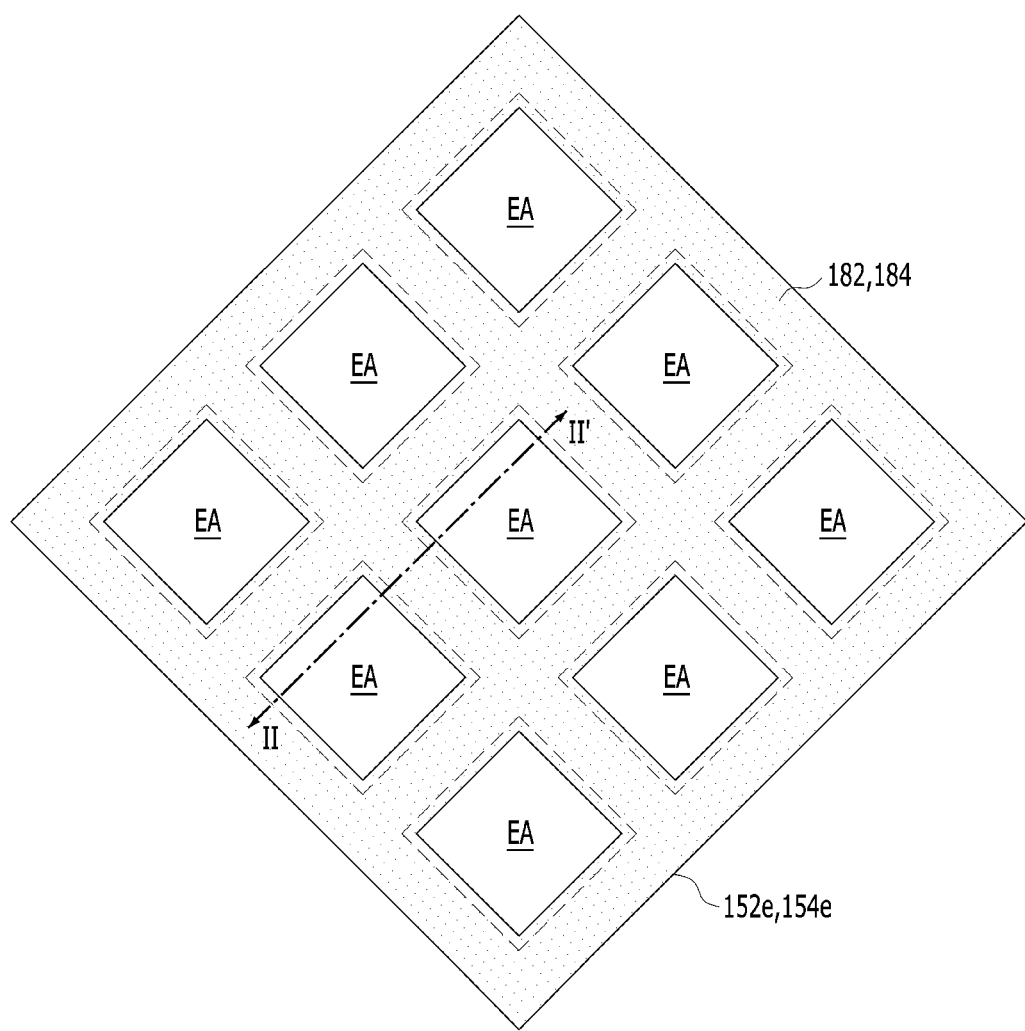
FIG. 4 is a detailed plan view showing the touch electrode shown in FIG. 2 according to one embodiment of the present disclosure.

In the present disclosure, the structure in which the first touch electrodes 152e and the second touch electrodes 154e are formed in a mesh shape will be described by way of example with reference to FIGS. 4 and 5. The mesh-shaped touch electrodes 152e and 154e correspond to the bank 128 disposed in a non-emission area NEA of each subpixel, and an opening area between the mesh-shaped touch electrodes 152e and 154e corresponds to an emission area EA of each subpixel. Each of the touch electrodes 152e and 154e includes a transparent conductive film, such as ITO or IZO, and a mesh metal film disposed above or under the transparent conductive film, the mesh metal film being formed in a mesh shape. Alternatively, each of the touch electrodes 152e and 154e may include only a mesh metal film. Here, the mesh metal film has a structure having at least one layer made of at least one of Ti, Al, Mo, MoTi, Cu, Ta, or ITO, which exhibits higher conductivity than the transparent conductive film, and is formed in a mesh shape. For example, the mesh metal film is formed to have a three-layer stack structure, such as Ti/Al/Ti, MoTi/Cu/MoTi, or Ti/Al/Mo. Consequently, the resistance and capacitance of each of the first and second touch electrodes 152e and 154e and the first and second bridges 152b and 154b are reduced, whereby an RC time constant is reduced and thus touch sensitivity is improved. In addition, the line width of the mesh metal film of each of the first and second touch electrodes 152e and 154e is very small, whereby it is possible to prevent the reduction of an aperture ratio and transmittance due to the mesh metal film.

Meanwhile, a display pad 168, which is connected to at least one of the data line DL, the scan line SL, the low-voltage (VSS) supply line, or the high-voltage (VDD) supply line, and a touch pad 160 are disposed in the non-active area NA. The display pad 168 and the touch pad 160 may be disposed in the portion of the non-active area NA corresponding to at least one of a one-side portion or an other-side portion of the substrate 111, or may be disposed in different portions of the non-active area NA. Meanwhile, the disposition of the touch pad 160 and the display pad 168 is not limited to the structure shown in FIG. 2. The disposition of the touch pad 160 and the display pad 168 may be variously changed depending on the design of the display panel.

The touch pad 160 and the display pad 168 are disposed on a dielectric film disposed under the light-emitting element 120. For example, the touch pad 160 is disposed on the substrate 111 together with the display pad 168. The touch pad 160 and the display pad 168 are formed to be exposed by a touch passivation film 158. Consequently, the touch pad 160 is connected to a signal transmission film having a touch-driving circuit (not shown) mounted thereon, and the display pad 168 is connected to a signal transmission film having at least one of a scan-driving unit or a data-driving unit mounted thereon. Meanwhile, the touch-driving circuit may be mounted in one of the data-driving unit and a timing controller.

The touch pad 160 includes first pad electrode 162 and second pad electrode 164, which are electrically connected to each other.

The first pad electrode 162 is made of the same material as the source and drain electrodes 136 and 138, and is disposed on the substrate 111. Meanwhile, the first pad electrode 162 may be made of the same material as the source and drain electrodes 136 and 138, and may be disposed in the same plane as the source and drain electrodes 136 and 138.

The second pad electrode 164 is made of the same material as a routing line 170, and is disposed on the touch dielectric film 156. The second pad electrode 164 is connected to the first pad electrode 162, which is exposed through a pad contact hole 166 formed through the touch dielectric film 156 and the touch buffer layer 148. Meanwhile, the routing line 170, which is connected to the second pad electrode 164, extends from each of the touch electrodes 152e and 154e, and is formed along the side surface of the encapsulation unit 140. At this time, the routing line 170 is disposed so as to cross at least one dam 106. The routing line 170 is made of the same material as the touch electrodes 152e and 154e, and is formed on the touch dielectric film 156. The routing line 170 overlaps a black layer 184 and a white layer 182, which are disposed on the touch passivation film 158, so as to reduce external light from being reflected by the routing line 170.

The touch passivation film 158 are formed to cover the touch sensor, which includes the touch electrodes 152e and 154e and the bridges 152b and 154b, in order to reduce the touch sensor from being corroded by external moisture. In addition, the touch passivation film 158 is made of an organic dielectric material, such as epoxy or acrylic, and is formed in the form of a thin film or a general film, or is made of an inorganic dielectric material, such as SiNx or SiOx.

Figure 5:
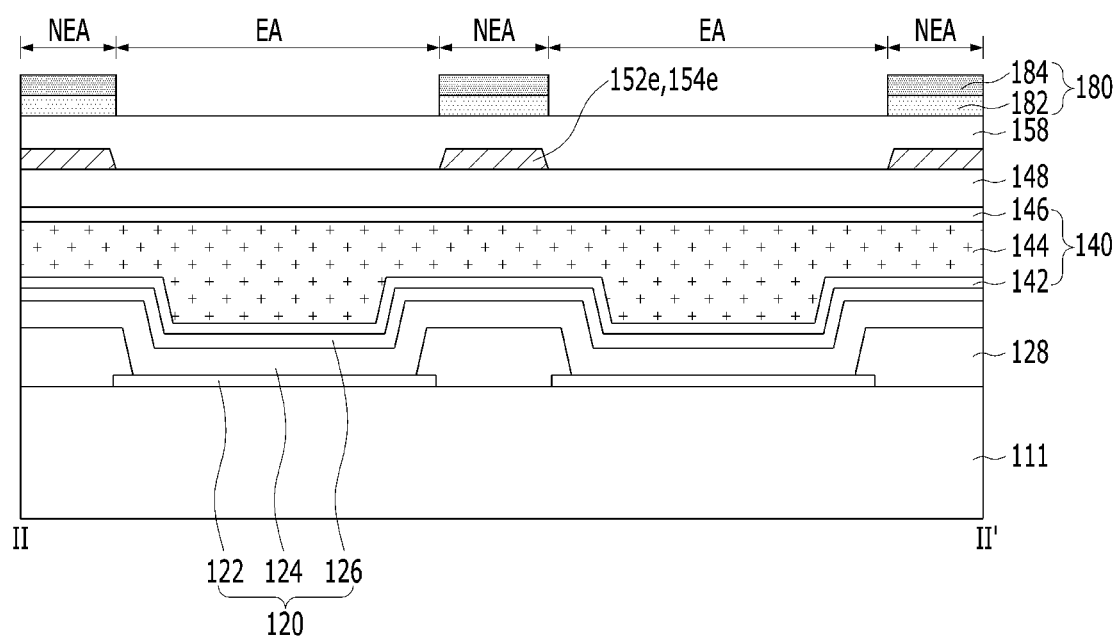
FIG. 5 is a sectional view of the organic light-emitting display panel taken along line II-II' of FIG. 4 according to one embodiment of the present disclosure.
Figure 6:
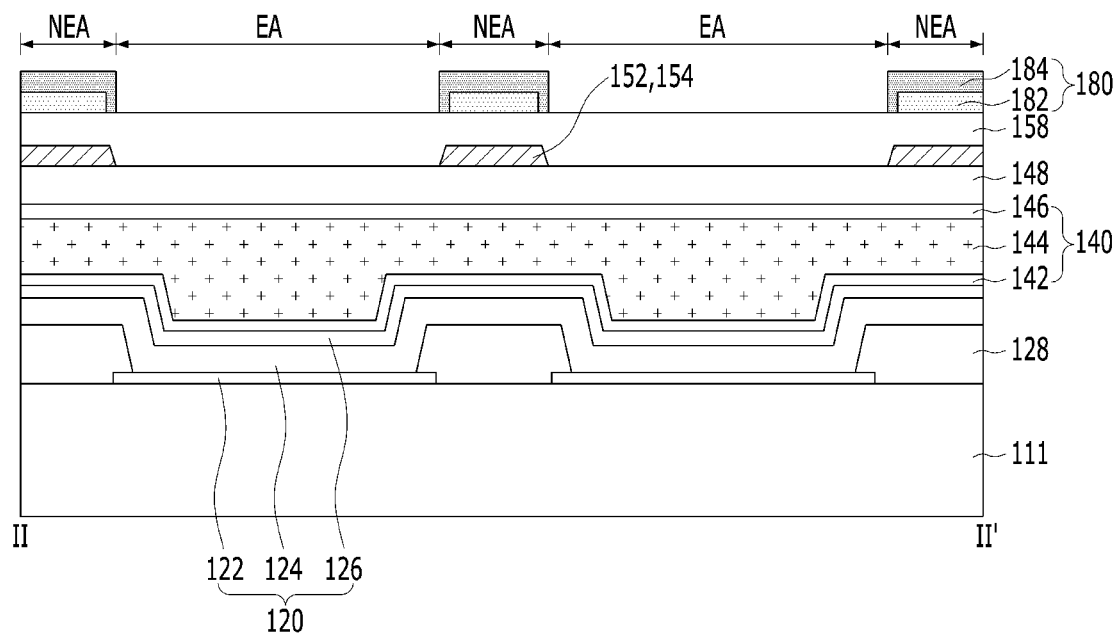
FIG. 6 is a sectional view showing another embodiment of the black layer shown in FIG. 5 according to one embodiment of the present disclosure.

As shown in FIGS. 5 and 6, an antireflective film 180 including a white layer 182 and a black layer 184 is disposed on the touch passivation film 158.

The black layer 184 reduces mixing of internal light generated by the light-emitting element 120 and absorbs external light incident from the outside. The black layer 184 is formed in a mesh (matrix) shape so as to overlap the mesh-shaped first and second touch electrodes 152e and 154e and the bank 128. That is, the black layer 184 is formed in the emission area EA, but is not formed in the non-emission area NEA. The black layer 184 may be formed on the white layer 182 so as to have the same line width as the white layer 182 in order to expose the side surface of the white layer 182, as shown in FIG. 5, or may be formed on the white layer 182 so as to have a larger line width than the white layer 182 in order to cover opposite side surfaces of the white layer 182, as shown in FIG. 6.

The black layer 184 includes black nanoparticles, a binder, and a sensitive emulsion. The black nanoparticles include at least one of carbon-black-based black nanoparticles, metal-oxide-based black nanoparticles, or organic-based black nanoparticles. TiNxOy or CuMnFeOx is used as the metal-oxide-based black nanoparticles, and lactam black or perylene black is used as the organic-based black nanoparticles.

Figure 7:
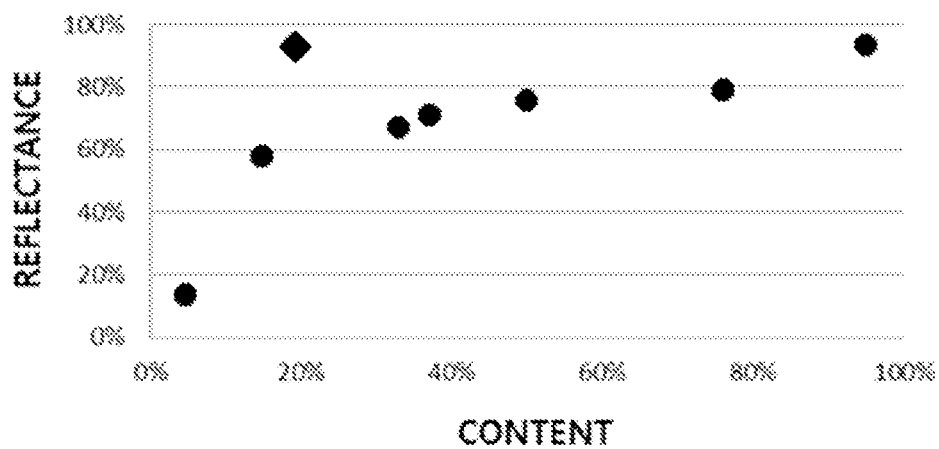
FIG. 7 is a view showing reflectance based on the content of white particles included in the white layer shown in FIG. 5 according to one embodiment of the present disclosure.

The white layer 182 is formed so as to overlap the black layer 184 while contacting the black layer 184 between the black layer 184 and the touch sensor. The white layer 182 is formed on the touch passivation film 158 in a mesh (matrix) shape so as to overlap the mesh-shaped first and second touch electrodes 152e and 154e and the bank 128. That is, the white layer 182 is formed in the emission area EA, but is not formed in the non-emission area NEA. The white layer 182 includes white nanoparticles, a binder, and a sensitive emulsion. The white nanoparticles include at least one of Ti-based white nanoparticles, silica-based white nanoparticles, metal-oxide-based white nanoparticles, or core-shell-based white nanoparticles. $TiO_2$ is used as the Ti-based white nanoparticles, spherical $SiO_2$, hollow $SiO_2$, fumed $SiO_2$, or colloidal $SiO_2$ is used as the silica-based white nanoparticles, $ZrO_2$, $Al_2O_3$, or $CeO_2$ is used as the metal-oxide-based white nanoparticles, and a silica-based core and a Ti-based shell are used as the core-shell-based white nanoparticles. As shown in FIG. 7, the higher the content of the white nanoparticles included in the white layer 182, the higher the reflectance. Consequently, the white nanoparticles may be included in the white layer 182 at a content of 90% to 97%.

Figure 8:
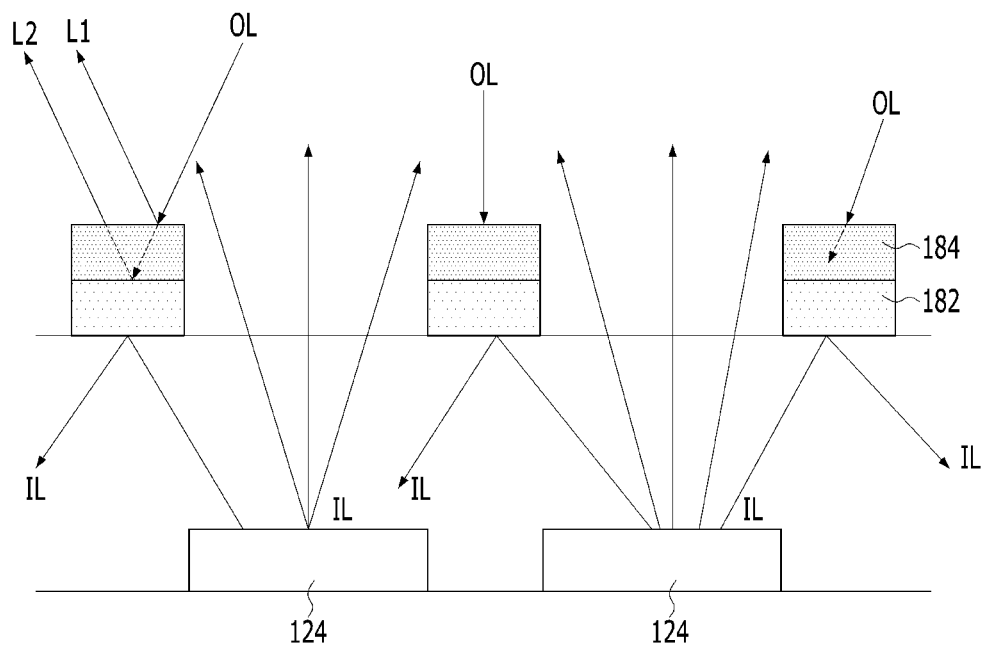
FIG. 8 is a view illustrating a process of reducing the reflection of external light in an organic light-emitting display panel having a black layer and a white layer according to one embodiment of the present disclosure.

As shown in FIG. 8, the white layer 182 changes the path of the internal light IL, generated by the light-emitting stack 124 and directed toward the non-emission area NEA, to the emission area EA. That is, the white layer 182 may reflect the internal light IL advancing to the non-emission area NEA to the emission area EA, whereby it is possible to improve the efficiency of the light that exits through the emission area EA.

A process of reducing the reflection of external light using the black layer 184 and the white layer 182 according to the present disclosure will be described with reference to FIG.

8. Most external light OL is absorbed and extinguished by the black layer 184. However, some of the external light OL is not absorbed by the black layer 184 but is reflected from the black layer 184 as a first reflection light beam L1. In addition, some of the external light absorbed by the black layer 184 is transmitted through the black layer 184 and is reflected from the black layer 184 as a second reflection light beam L2. At this time, the first and second reflection light beams L1 and L2 have opposite phases, whereby the first and second reflection light beams L1 and L2 destructively interfere with each other and thus are extinguished.

In the present disclosure, as described above, the external light is absorbed using the black layer 184, and the external light is extinguished through destructive interference using the black layer 184 and the white layer 182, whereby it is possible to prevent the reflection of the external light. In particular, as shown in Table 1, the reflectance of external light is 6.5% according to Comparative Example 1, in which a low-reflective metal is used, and the reflectance of external light is 5.3% according to Comparative Example 2, in which a black layer is used, whereas the reflectance of external light is less than 5.0%, i.e. 1.6%, according to Example, in which the black layer 184 and the white layer 182 are used. Consequently, i the reflectance of external light according to Example is lower than the reflectance of external light according to each of Comparative Examples 1 and 2.

TABLE 1

|  | Comparative Example 1 | Comparative Example 2 | Example |
| --- | --- | --- | --- |
| Reflectance | 6.5% | 5.3% | 1.6% |

Figure 9A:
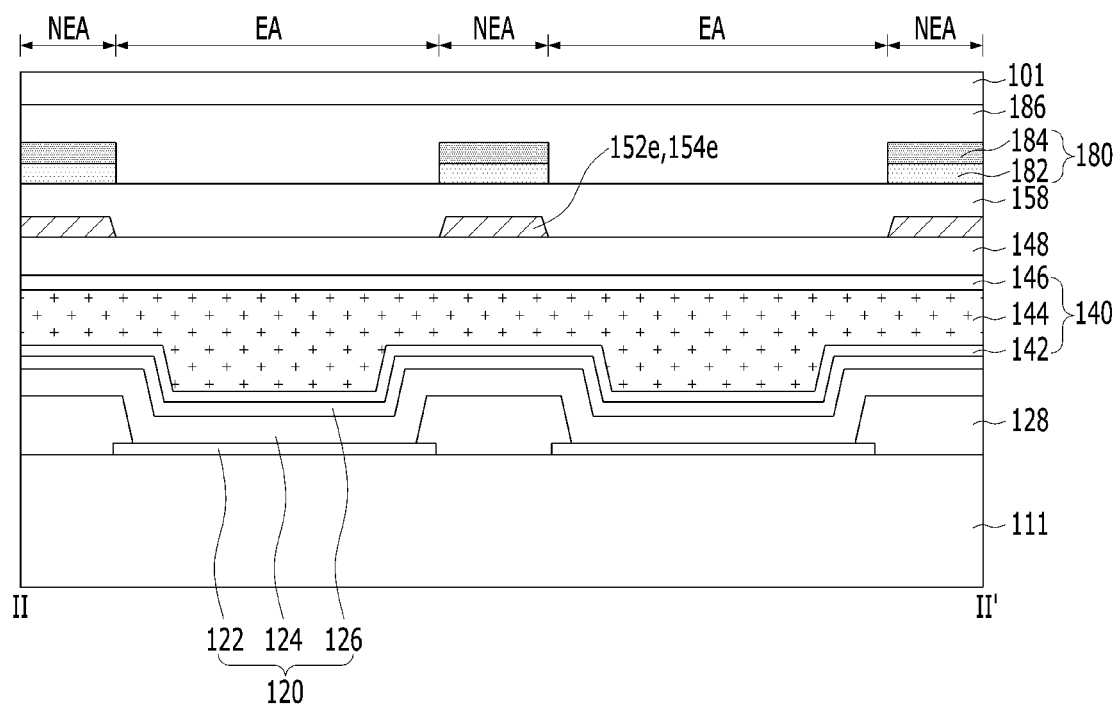
FIGS. 9A and 9B are sectional views showing an organic light-emitting display panel having a cover substrate according to one embodiment of the present disclosure.
Figure 9B:
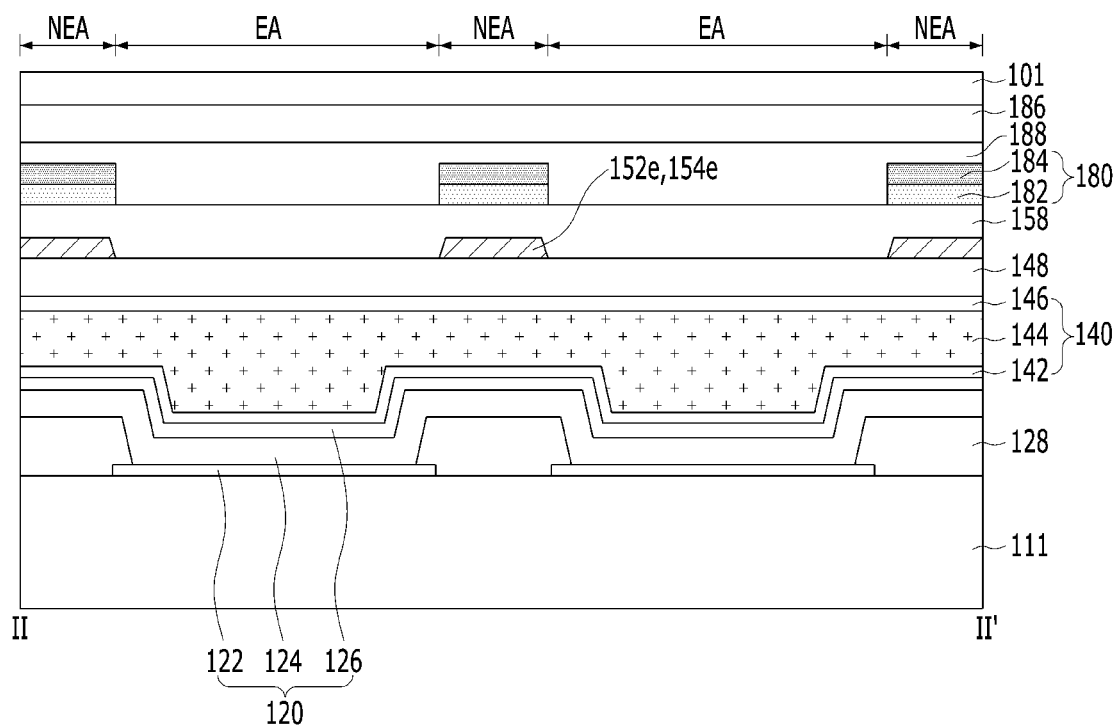

In the present disclosure, as described above, it is possible to reduce external light from being incident on the touch sensor and the routing line 170 using the black layer 184 and the white layer 182, whereby it is possible to reduce the reflectance of the external light. In the present disclosure, therefore, it is possible to reduce a reduction in external visibility, and therefore it is possible to obviate a polarizing plate, which is expensive. Also, in the present disclosure, because the expensive polarizing plate is obviated, it is possible to improve transmittance and luminance. Consequently, the power consumption thereof is reduced, and the lifespan thereof is increased. Meanwhile, the substrate 111, on which the black layer 184 and the white layer 182 according to the present disclosure are formed, is laminated with a cover substrate 101 via an adhesive film 186, as shown in FIGS. 9A and 9B. The adhesive film 186 is formed between the black layer 184 and the cover substrate 101 in the form of an optical clear adhesive (OCA) or an optical clear resin (OCR). The adhesive film 186 and the black layer 184 may contact each other, as shown in FIG. 9A, or an optical film 188 may be disposed between the adhesive film 186 and the black layer 184, as shown in FIG. 9B. A semi-transmissive film or an OLED transmittance controllable film (OTF) is used as the optical film 188.

A display device comprising a display panel with touch sensors shown in FIG. 1 and FIG. 2 is further disclosed according to another embodiment of the present invention. And the same description for the display panel with touch sensors in the display device will be omitted here.

As is apparent from the above description, in the present invention, it is possible to reduce external light from being incident on the touch sensor and the cathode electrode using the antireflective film (for example, the black layer and the white layer), whereby it is possible to reduce the reflectance of external light. In the present disclosure, therefore, it is possible to reduce a reduction in external visibility without using a separate optical film (e.g. a polarizing plate). Also, in the present disclosure, it is possible to improve the transmittance, luminance, and lifespan of the display panel and the display device. Consequently, it is possible to reduce the thickness and the power consumption of the display panel and the display device.

It will be apparent to those skilled in the art that various modifications and variations can be made in the present invention without departing from the spirit or scope of the invention. Thus, it is intended that the present invention covers such modifications and variations to this invention provided they come within the scope of the appended claims and their equivalents.

What is claimed is:

1. A display device comprising:
   a light-emitting element on a substrate;
   an encapsulation unit on the light-emitting element, the encapsulation unit including at least one inorganic encapsulation layer and at least one organic encapsulation layer;
   a touch sensor on the encapsulation unit; and
   a black layer on the touch sensor, the black layer located in a non-emission area that excludes an emission area in which the light-emitting element is disposed.

2. The display device according to claim 1, wherein the black layer overlaps the touch sensor.

3. The display device according to claim 2, wherein the black layer includes at least one of black nanoparticles, a binder, or a sensitive emulsion.

4. The display device according to claim 2, wherein the touch sensor comprises:
   first touch electrodes arranged in a first direction, the first touch electrodes connected to each other via a first bridge; and
   second touch electrodes arranged in a second direction that is different from the first direction, the second touch electrodes connected to each other via a second bridge,
   wherein the first touch electrodes and the second touch electrodes are in a mesh shape.

5. The display device according to claim 4, wherein each of the first touch electrodes and the second touch electrodes includes a mesh film or includes a transparent conductive film and a mesh metal film disposed above or under the transparent conductive film.

6. The display device according to claim 4, wherein the black layer is in a mesh shape.

7. The display device according to claim 6, wherein the mesh-shaped black layer has opening areas, and the opening areas overlap the emission area.

8. The display device according to claim 4, wherein the mesh-shaped first touch electrodes and the mesh shaped second touch electrodes have opening areas, respectively, and
   wherein the opening areas of the first touch electrodes and the opening areas of the second touch electrodes overlap the emission area.

9. The display device according to claim 4, further comprising:
   a bank in the non-emission area, the bank exposing an anode electrode of the light-emitting element,
   wherein the black layer overlaps the bank.

10. The display device according to claim 9, wherein the first bridge and the second bridge overlap the bank.

11. The display device according to claim 4, further comprising:
   a touch passivation film between the touch sensor and the black layer.

12. The display device according to claim 11, wherein the touch passivation film comprises an inorganic material.

13. The display device according to claim 12, wherein the inorganic material includes a silicon oxide layer or a silicon nitride layer.

14. The display device according to claim 11, wherein the touch passivation film comprises an organic material.

* * * * *